(12) United States Patent
Hafed

(10) Patent No.: US 7,813,297 B2
(45) Date of Patent: Oct. 12, 2010

(54) HIGH-SPEED SIGNAL TESTING SYSTEM HAVING OSCILLOSCOPE FUNCTIONALITY

(75) Inventor: Mohamed M. Hafed, Montreal (CA)

(73) Assignee: DFT Microsystems, Inc., Burlington, MA (US)

( * ) Notice: Subject to any disclaimer, the term of this patent is extended or adjusted under 35 U.S.C. 154(b) by 414 days.

(21) Appl. No.: 11/776,865

(22) Filed: Jul. 12, 2007

(65) Prior Publication Data

US 2008/0013456 A1 Jan. 17, 2008

Related U.S. Application Data

(60) Provisional application No. 60/830,797, filed on Jul. 14, 2006.

(51) Int. Cl.
H04L 12/26 (2006.01)

(52) U.S. Cl. .................. 370/252; 375/226; 375/219; 714/742; 714/815

(58) Field of Classification Search ............ 370/252, 370/241, 249, 366; 375/226, 219, 224; 714/738, 714/742, 815
See application file for complete search history.

(56) References Cited

U.S. PATENT DOCUMENTS

| | | | |
|---|---|---|---|
| 3,931,610 A | 1/1976 | Marin et al. | |
| 3,976,940 A | 8/1976 | Chau et al. | |
| 4,807,147 A | 2/1989 | Halbert et al. | |
| 5,329,258 A | 7/1994 | Matsuura | |
| 5,517,147 A | 5/1996 | Burroughs et al. | |
| 5,563,921 A | 10/1996 | Mesuda et al. | |
| 5,835,501 A | 11/1998 | Dalmia et al. | |
| 5,883,523 A | 3/1999 | Ferland et al. | |
| 5,948,115 A | 9/1999 | Dinteman | |
| 6,008,703 A | 12/1999 | Perrott et al. | |
| 6,057,679 A | 5/2000 | Slizynski et al. | |
| 6,076,175 A | 6/2000 | Drost et al. | |
| 6,091,671 A | 7/2000 | Kattan | |
| 6,181,267 B1 | 1/2001 | MacDonald et al. | |
| 6,225,840 B1 | 5/2001 | Ishimi | |

(Continued)

FOREIGN PATENT DOCUMENTS

JP 2005006071 A 1/2005

OTHER PUBLICATIONS

Hafed et al., "A High-Throughput 5 GBPS Timing and Jitter Test Module Featuring Localized Processing," International Test Conference 2004, Oct. 26, 2004-Oct. 28, 2004 Charlotte Convention Center, Charlotte, NC, ETATS-UNIS (2004), IEEE Catalog No. 04CH37586, ISBN: 0-7803-8580-2, pp. 728-737.

(Continued)

*Primary Examiner*—Dang T Ton
*Assistant Examiner*—Nourali Mansoury
(74) *Attorney, Agent, or Firm*—Downs Rachlin Martin PLLC

(57) ABSTRACT

A high-speed signal testing system that includes a digital circuitry for providing a pattern tester with oscilloscope functionality at minimal implementation cost. The digital circuitry includes a time-base generator that provides a high-speed repeating time-base signal. The time-base signal, in conjunction with a sub-sampler and an accumulation memory, allows the system to zoom in on, and analyze portions of, one or more bits of interest in a repeating pattern present on the signal under test. Such portions of interest include rising and falling edges and constant high and low bit values.

24 Claims, 7 Drawing Sheets

U.S. PATENT DOCUMENTS

| | | |
|---|---|---|
| 6,329,850 B1 | 12/2001 | Mair et al. |
| 6,356,850 B1 | 3/2002 | Wilstrup et al. |
| 6,374,388 B1 | 4/2002 | Hinch |
| 6,420,921 B1 | 7/2002 | Okayasu et al. |
| 6,570,454 B2 | 5/2003 | Skierszkan |
| 6,629,274 B1 | 9/2003 | Tripp et al. |
| 6,640,193 B2 | 10/2003 | Kuyel |
| 6,650,101 B2 | 11/2003 | MacDonald et al. |
| 6,658,363 B2 | 12/2003 | Mejia et al. |
| 6,665,808 B1 | 12/2003 | Schinzel |
| 6,768,360 B2 | 7/2004 | Tsuruki |
| 6,768,390 B1 | 7/2004 | Dunsmore et al. |
| 6,775,809 B1 | 8/2004 | Lambrecht et al. |
| 6,785,622 B2 | 8/2004 | Nygaard, Jr. |
| 6,791,389 B2 | 9/2004 | Mikami et al. |
| 6,816,987 B1 | 11/2004 | Olson et al. |
| 6,816,988 B2 | 11/2004 | Barford |
| 6,834,367 B2 | 12/2004 | Bonneau et al. |
| 6,842,061 B2 | 1/2005 | Suda et al. |
| 6,859,106 B2 | 2/2005 | Sano |
| 6,865,222 B1 | 3/2005 | Payne |
| 6,865,496 B2 | 3/2005 | Camnitz et al. |
| 6,868,047 B2 | 3/2005 | Sartschev et al. |
| 6,888,412 B2 | 5/2005 | Kim et al. |
| 6,907,553 B2 | 6/2005 | Popplewell et al. |
| 6,909,316 B2 | 6/2005 | Owens et al. |
| 6,909,980 B2 | 6/2005 | Fernando |
| 6,918,073 B2 | 7/2005 | Linam et al. |
| 6,931,579 B2 | 8/2005 | Roberts et al. |
| 6,934,896 B2 | 8/2005 | Larson et al. |
| 6,940,330 B2 | 9/2005 | Okayasu |
| 6,944,835 B2 | 9/2005 | Okayasu |
| 6,961,745 B2 | 11/2005 | Laquai |
| 6,993,109 B2 | 1/2006 | Lee et al. |
| 7,136,772 B2 | 11/2006 | Duchi et al. |
| 7,287,200 B2 | 10/2007 | Miyaji |
| 7,355,378 B2 | 4/2008 | Rottacker et al. |
| 2001/0028251 A1 | 10/2001 | Okayasu |
| 2002/0019962 A1 | 2/2002 | Roberts et al. |
| 2002/0033878 A1 | 3/2002 | Satoh et al. |
| 2003/0122600 A1 | 7/2003 | Engl et al. |
| 2003/0128720 A1 | 7/2003 | Jones |
| 2003/0165051 A1 | 9/2003 | Kledzik et al. |
| 2003/0198311 A1 | 10/2003 | Song et al. |
| 2004/0051571 A1 | 3/2004 | Okamura |
| 2005/0014300 A1 | 1/2005 | Welch et al. |
| 2005/0046584 A1 | 3/2005 | Breed |
| 2005/0058234 A1 | 3/2005 | Stojanovic |
| 2005/0094927 A1 | 5/2005 | Kish et al. |
| 2005/0286436 A1 | 12/2005 | Flask |
| 2006/0005093 A1 | 1/2006 | Leslie |
| 2006/0139387 A1 | 6/2006 | Silverbrook et al. |
| 2007/0113119 A1 | 5/2007 | Hafed |
| 2008/0048726 A1 | 2/2008 | Hafed |
| 2008/0192814 A1 | 8/2008 | Hafed |

OTHER PUBLICATIONS

Hafed, et al., "An 8-Channel, 12-bit, 20 MHz Fully Differential Tester IC for Analog and Mixed-Signal Circuits," Solid-State Circuits Conference, 2003, ESSCIRC 2003, proceedings of the 29th European; Published Sep. 16, 2003, pp. 193-196; ISBN: 0-7803-7995-0.

Hafed et al., "A 5-Channel, Variable Resolution 10-GHz Sampling Rate Coherent Tester/Oscilloscope IC and Associated Test Vehicles," IEEE Mar. 2003, Custom Integrated Circuits Conference, pp. 621-624.

Hafed et al., "A 4-GHz Effective Sample Rate Integrated Test Core for Analog and Mixed-Signal Circuits," IEEE Journal of Solid-State Circuits, vol. 37, No. 4, Apr. 2002, pp. 499-514.

Hafed et al., "Test and Evaluation of Multiple Embedded Mixed-Signal Test Cores," International Test Conference 2002, paper 35.3, ISBN 0-7803-7542-4, pp. 1022-1030.

Hafed et al., "Sigma-Delta Techniques for Integrated Test and Measurement," IEEE Instrumentation and Measurement Technology Conference, Budapest, Hungary, May 21-23, 2001; 0-7803-6646.

Larsson, Patrick, "A 2-1600-MHz CMOS Clock Recovery PLL with Low-Vdd Capability," In Solid-State Circuits, IEEE Journal, Dec. 1999, vol. 34, Issue 12, pp. 1951-1960.

International Search Report and Written Opinion dated Feb. 12, 2008 for corresponding PCT application PCT/US06/60295 filed Oct. 27, 2006 entitled "High-Speed Transceiver Tester Incorporating Jitter Injection," Hafed et al.

Mohamed Hafed et al, "Massively Parallel Validation of High-Speed Serial Interfaces Using Compact Instrument Modules," IEEE, International Test Conference, Paper 9.2; 1-4244-0292, Jan. 2, 2006, pp. 1-10.

International Search Report and Written Opinion dated Jul. 22, 2008 for related application PCT/US08/53476 filed Feb. 8, 2008 entitled "System and Method for Physical-Layer Testing of High-Speed Serial Links in their Mission Environment," Hafed et al.

International Search Report and Written Opinion dated Mar. 11, 2008 for related application PCT/US07/73458 filed Jul. 13, 2007 entitled "High-Speed Signal Testing System Having Oscilloscope Functionability," Hafed.

Related application U.S. Appl. No. 12/026,760, filed Feb. 6, 2008 entitled "Systems and Methods for Testing and Diagnosing Delay Faults and for Parametric Testing in Digital Circuits," Hafed.

International Search Report and Written Opinion dated Aug. 1, 2008 for related application PCT/US07/73454 filed Jul. 13, 2007 entitled "Signal Integrity Measurement System and Methods Using a Predominantly Digital Time-Base Generator," Hafed.

Notice of Allowance dated Oct. 28, 2009, with regard to related U.S. Appl. No. 11/776,825, filed Jul. 12, 2007, Mohamed M. Hafed.

First Examination Report issued by European Patent Office dated Nov. 16, 2009, in connection with related European Patent Appl. No. 05744211.3, entitled System and Method for Generating a Jittered Test Signal, Hafed, Mohamed M. et al.

Shimanouchi, Masashi, Periodic Jitter Injection with Direct Time Synthesis by SPP ATE for SerDes Jitter Tolerance Test in Production, ITC International Test Conference; Paper 3.1; 0-7803-8106; Aug. 2003; IEEE, pp. 48-57.

FIG. 5

Voltage Comparator Output *504*

Bit of Interest *500*

Data Pattern *260B*

Thermometer Code *600*

0000000/111111111111111111111
000000/1111111111111111111111
00000/11111111111111111111111
0001/111111111111111111111111

Digital Bit Stream 804

HIGH-SPEED SIGNAL TESTING SYSTEM HAVING OSCILLOSCOPE FUNCTIONALITY

RELATED APPLICATION DATA

This application claims the benefit of priority of U.S. Provisional Patent Application Ser. No. 60/830,797, filed on Jul. 14, 2006, and titled "Signal Integrity Measurement System And Method Using A Predominantly Digital Time-Base Generator," which is incorporated herein by reference in its entirety.

FIELD OF INVENTION

The present invention relates generally to the measurement of high-speed digital data. More particularly, the present invention is directed to a high-speed signal testing system having oscilloscope functionality.

BACKGROUND

Digital communication speeds within semiconductor components, between semiconductor components, and between boards and cabinets continue to increase. As speeds increase, testing digital signals does not only involve logic (pattern) testing, but also requires analog parametric testing. With increased speeds, the analog shape of the voltage waveform representing the binary digital data is important. Poor analog parameters such as too long a rise time or too small a voltage swing may result in long term issues that are not uncovered using quick pattern tests. Conversely, analog parameter testing is also useful when debugging failures in logic or pattern tests. Such failures can be caused by systematic phenomena that manifest themselves in waveform shape or timing jitter.

In the present state of the art, separate pieces of equipment are often required to perform logic testing and analog parametric testing, respectively. For example, a logic analyzer or a bit-error-rate tester (BERT) is used for pattern testing and an oscilloscope or jitter analyzer is used for eye diagram testing or jitter testing. As the need to test high-speed digital signals proliferates more into large pin-count devices or circuits, there arises a need to combine some of the capabilities of various pieces of equipment. There is also a need to integrate such capabilities in devices or in small form factors that can fit on application devices or on application boards. For example, a test-related module or component can be placed on a system to perform the digital testing functions. Many high-speed serial receivers now contain a pattern checker for the purpose of digital testing. Adding oscilloscope capability to this basic pattern checking capability is highly desired, but not trivial.

By way of example using commercial test equipment, enabling a BERT or logic analyzer to perform eye diagram analysis simplifies testing and provides enhanced coverage with one piece of equipment instead of two. Such equipment already exists. However, given the contradicting requirements between pattern testing and analog parametric testing, creating such dual-function equipment entails intricate modifications to the basic architecture of the equipment that limits scalability. In particular, to enable a BERT to generate an eye diagram, the former is modified in two main ways. First, analog delay line circuitry is introduced that can delay a data signal or a clock signal, or both, by very small amounts (fraction of data pattern unit interval). The delay line circuitry is area-consuming, bandwidth-limited, and difficult to calibrate. It becomes unmanageable when several test channels are required, as is the case in modern applications or applications in which the pattern tester is integrated within a system.

The other modification that is required involves the front-end capture electronics. Specifically, logic testing merely requires a voltage comparator at the front end of the equipment whereas a measurement such as an eye diagram requires a more complex circuit. To modify a BERT to perform eye diagram measurement, engineers create a window comparator (two or more voltage comparators with similar but slightly offset threshold levels) to detect a transition through a very narrow voltage plane and associated time point. Alternatively, instead of deploying two or more comparators to perform a window comparison, another implementation involves two slightly delayed strobes applied to a single voltage comparator, the delay being a small fraction of the data pattern unit interval. This approach is again complicated and difficult to implement at very high speeds.

SUMMARY OF THE DISCLOSURE

One aspect of the present invention is a system for testing a high-speed repeating data signal, comprising: a time-base generator responsive to a reference clock signal so as to generate a high-speed repeating signal; a one-bit voltage digitizer for digitizing the high-speed repeating data signal into a digitized signal as a function of the high-speed repeating signal; a digital comparator for comparing the digitized signal to a selected digital value and outputting comparator results as a function of the high-speed repeating signal; a bit-shift and frequency-divider block responsive to the high-speed repeating signal so as to produce a slowed clock signal; a sub-sampler for sub-sampling the comparator results as a function of the slowed clock signal so as to output sub-sampled results; a modulo N address counter for providing write addresses as a function of the high-speed repeating signal; and an accumulation memory for storing ones of the sub-sampled results as a function of the slowed clock signal and corresponding respective ones of the write addresses.

Another aspect of the present invention is a system for testing a high-speed repeating data signal, comprising: oscilloscope circuitry that includes: a time-base generator responsive to a reference clock signal so as to generate a high-speed repeating signal; a one-bit voltage digitizer for digitizing the high-speed repeating data signal into a digitized signal as a function of the high-speed repeating signal; a reference pattern memory for storing a reference bit pattern having a length B; a selector for selecting between the reference bit pattern and a constant bit value so as to output a selected digital value; a digital comparator for comparing the digitized signal to the selected digital value and outputting comparator results as a function of the high-speed repeating signal; a bit-shift and frequency-divider block responsive to the high-speed repeating signal so as to produce a slowed clock signal, the bit shift and frequency divider block divides the high-speed repeating signal by B; a sub-sampler for sub-sampling the comparator results as a function of the slowed clock signal so as to output sub-sampled results; a modulo N address counter for providing write addresses as a function of the high-speed repeating signal; and an accumulation memory for storing ones of the sub-sampled results as a function of the slowed clock signal and corresponding respective ones of the write addresses.

Still another aspect of the present invention is a method of implementing an oscilloscope to analyze a high-speed data signal, comprising: digitizing the high-speed data signal into a one-bit digitized signal in response to a repeating time-base signal having a time-base span N; comparing the one-bit digitized signal to a constant bit value in response to the repeating time-base signal so as to generate comparator results; dividing the repeating time-base signal so as to create a slowed clock signal corresponding to high-speed data period; sub-sampling the comparator results in response to the slowed clock signal so as to output sub-sampled results; generating modulo N write addresses as a function of the repeating time-base signal; and storing ones of said sub-sampled results in a memory in response to the slowed clock signal and corresponding respective ones of the write addresses.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 5 is a diagram illustrating a single sequence of bits stored in the accumulative memory of the digital pattern testing system of FIG. 2, the sequence of bits resulting from setting the threshold voltage of the receive comparator at a fixed value and running the time-base generator for a particular data pattern bit;

FIG. 6 is a diagram illustrating multiple sequences of bits stored in the accumulative memory of the digital pattern testing system of FIG. 2, the multiple sequences of bits resulting from sweeping the threshold voltage of the receive comparator at differing fixed values and running the time-base generator at the differing values for a particular data pattern bit;

DETAILED DESCRIPTION

Figure 1:
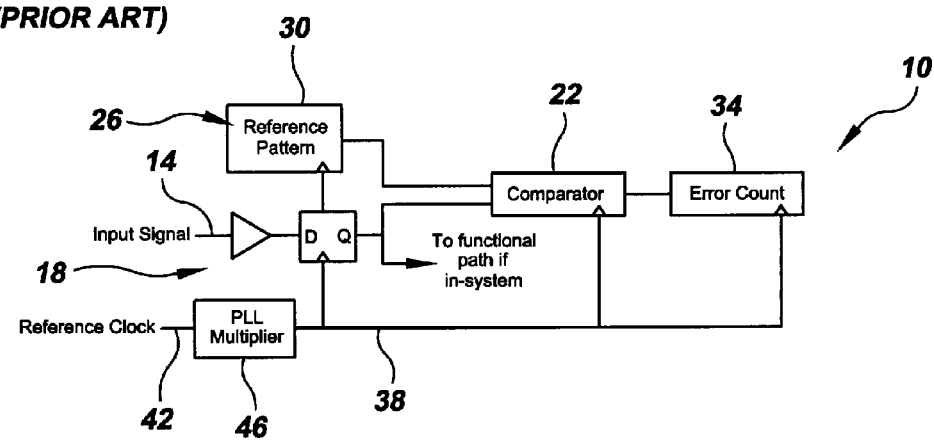
FIG. 1 is a high-level schematic diagram of a prior-art digital pattern tester.

FIG. 1 shows a prior-art digital pattern tester 10 for testing logical integrity of an input signal 14 input into the tester. As mentioned in the Background section above, tester 10 could be part of the design of a high-speed digital communications device (not shown), or it could be a standalone piece of equipment, such as a BERT or logic analyzer. The front-end of tester 10 is a voltage comparator 18 that "slices" the voltage of incoming signal 14 and recovers a logical value from it. The logical value is "1" when the input signal is larger than the voltage threshold of comparator 18 and "0" otherwise. Using a digital comparator 22, the logical value is then compared, bit for bit, to a reference pattern 26 stored in an onboard memory 30. An error counter 34 keeps track of the number of mismatches between the logical values derived from input signal 14 on the one hand and the corresponding respective bits of reference pattern 26 on the other.

Digital comparator 22 is clocked by an onboard clock signal 38 that is centered at the middle of the data bit that is being compared. This minimizes the likelihood of a sampling error. Depending on the architecture, the centering operation either happens with delay lines (not shown) on the clock signal or with a phase tracking circuit (not shown), such as a clock-and-data recovery (CDR) circuit. The latter scenario is more common in in-system applications. Also possibly included is a digital pattern alignment block (not shown) that shifts reference pattern 26 until the least amount of errors is observed. In any case, reference clock 42 provided to tester 10 can be at a low frequency, with subsequent multiplication, typically using a phase-locked loop (PLL) multiplier 46, to the target high-speed frequency. In one example, multiplication can increase a 100 MHz clock signal to a 5 GHz sampling signal.

Figure 2:
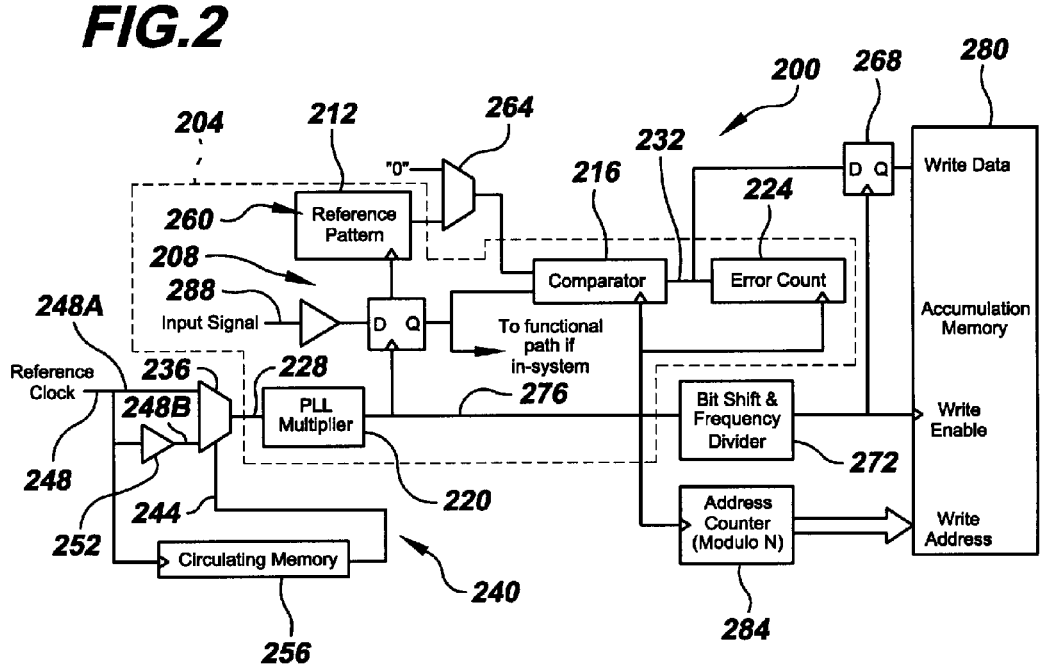
FIG. 2 is a high-level schematic diagram of a digital pattern testing system of the present disclosure that includes oscilloscope functionality.

Referring now to FIG. 2, this figure shows an exemplary digital pattern testing system 200 that includes an oscilloscope feature that enables the capture of oscilloscope traces of transition or non-transition bits. As will be readily seen by visually comparing FIGS. 1 and 2 with each other, exemplary testing system 200 is based on the design of pattern tester 10 of FIG. 1, the major components of which are located within the dashed outline 204. That is, like tester 10 of FIG. 1, testing system 200 of FIG. 2 includes a front end voltage comparator 208, a reference pattern memory 212, a digital comparator 216, a frequency-scaling PLL multiplier 220, and an error counter 224. As can further be seen comparing FIGS. 1 and 2 to each other, additions made to the conventional tester components within dashed outline 204 of FIG. 2 include additions to the input 228 of PLL multiplier 220 and to the output 232 of digital comparator 216. As will be seen, both of these modifications are digital in nature, and can be implemented without much of the risks described earlier using conventional methods.

In the first modification, input 228 of PLL multiplier 220 is preceded by a multiplexer 236 and other components as described below to provide a high-frequency time-base generator 240, which may be, for example, any one of the time-base generators described in U.S. patent application Ser. No. 11/776,825, filed on Jul. 12, 2007, and titled "Signal Integrity Measurement Systems And Methods Using A Predominantly Digital Time-Base Generator," which is incorporated by reference herein for all that it discloses relative to time-base generators. In the example shown, multiplexer 236 is responsive to a selection signal 244 that continually selects between two inputs, which in this case are two versions of an incoming reference clock signal 248, an undelayed version 248A and a coarsely delayed version 248B that is delayed using a coarse delay 252. Coarse delay is defined as any delay that is substantially larger than the minimum delay that can be reliably constructed using conventional technology. Typically, such delay is equivalent to minimum bit period in a high speed communications device. In general and as described in the '825 application, however, the selectable input signals to multiplexer 236 may be any two or more clock signals that are coarsely delayed relative to one another. In this example, selection signal 244 comes from an onboard circulating memory 256 that is clocked by incoming reference clock 248. The combination of PLL multiplier 220, multiplexer 236, coarse delay 252 to create the delayed version 248B of clock signal 248, selection signal 244, and onboard memory 256 driving the selection signal constitute a time-base generator 240 that replaces any analog delay lines that are required in a conventional system. The advantage of using digital logic over analog logic especially in in-system applications are well known to those versed in the art.

In addition to time-base generator 240, to enable oscilloscope measurement without implementing a window comparator or a more complicated front-end, the digital logic down stream of voltage comparator 208 is modified, for example, as shown in FIG. 2. First, during oscilloscope mode, the reference pattern 260 can be replaced by a constant logical value, such as 0. Selection between the oscilloscope mode and the bit-pattern testing mode can be facilitated, for example, by a multiplexer 264 that allows selection between the constant logical 0 signal and the output of reference pattern memory 212. Digital comparator 216 can remain the same as digital comparator 22 of FIG. 1 for simplicity if desired. Additionally, in the oscilloscope mode, error counter 224 may be bypassed and replaced by a sub-sampling flip-flop 268. As will be described shortly, sub-sampling flip-flop 268 serves the function of locking onto a single bit in the high-speed pattern being tested.

Figure 3:
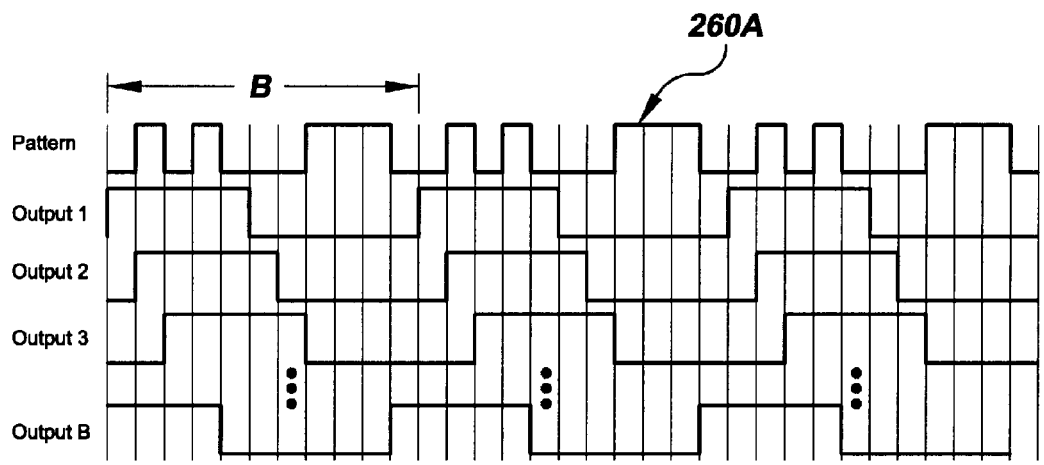
FIG. 3 is a timing diagram illustrating the functioning of frequency divider block of the digital pattern testing system of FIG. 2 for the frequency divider value B equal to 11.

Effectively, when testing system 200 is in oscilloscope mode, the system is designed to zoom into a particular edge or other portion of the pattern and analyze it. To achieve this, sub-sampling flip-flop 268 is driven by a bit-shift and frequency-divider block 272 responsive to the output 276 of time-base generator 240. The frequency division of bit-shift and frequency-divider block 272 is set to a value equal to the length B of pattern 260. If pattern 260 is a pseudo-random bit sequence (PRBS) having a pattern length B of 127 bits, the frequency divider value is 127. The bit shifting operation of bit-shift and frequency-divider block 272 moves this sloweddown clock in single-bit increments, potentially placing it at each of the 127 positions in original periodic test pattern 260. FIG. 3 shows the operation of bit-shift and frequency-divider block 272 (FIG. 2)for a pattern 260A having length B of 11. The 11 shifted outputs Output 1 through Output B (B=11) of bit-shift and frequency-divider block 272 are illustrated. Any one of these outputs is generated at a given time. Intuitively from this figure, sub-sampling flip flop 268 (FIG. 2) only looks at the digital comparison result every 11 data beats, instead of every data beat. It only looks at the comparison result for a single bit in the whole repeating pattern 260A.

Referring again to FIG. 2, the output of the sub-sampled comparison operation may be accumulated in an accumulation memory 280 having an address counter 284 clocked by time-base generator 240. The importance of addressing using address counter 284 this way is described below. For now, its is noted that because division ratio of bit-shift and frequency-divider block 272 is equal to pattern length B in FIG. 2, the accumulation results may arrive into accumulation memory 280 out of order, but if certain guidelines are followed, all locations in the memory will be covered (see below).

Figure 4:
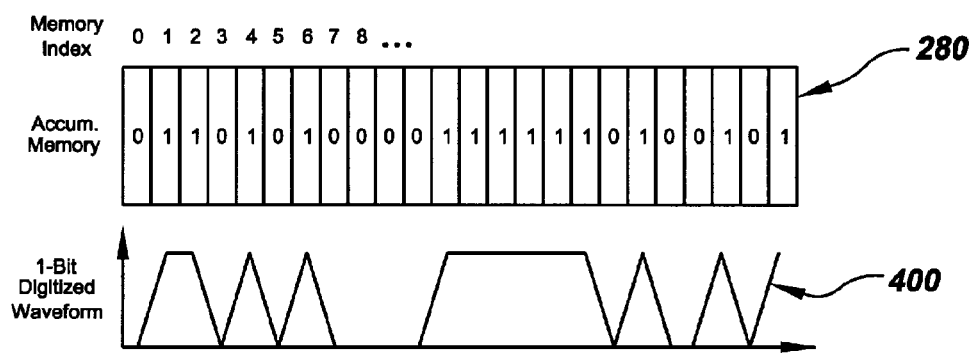
FIG. 4 is a diagram illustrating the contents of the accumulative memory of the digital pattern testing system of FIG. 2 for a one-bit digitized waveform.

As discussed in detail in the '825 patent application, each time PLL multiplier 220 toggles its output 276 is slightly delayed. Thus, every time voltage comparator 208 is clocked, it strobes the incoming bit stream of input signal 288 at a slightly different delay. Similarly, every time sub-sampling flip flop 268 is clocked with the slowed-down clock of bit-shift and frequency-divider block 272, it, too, corresponds to a slightly different delay. If time-base generator 240 is programmed to generate a constant ramp (see the '825 patent application for a description of programming a time-base generator), the output 276 of PLL multiplier 220 is constantly advanced or delayed by a fixed amount according to the ramp behavior. Each entry in accumulation memory 280 is designed to correspond to a single delay value out of PLL multiplier 220. Thus, and referring to FIG. 4, at the termination of one complete sweep of the time-base ramp, accumulation memory 280 will contain a time-domain waveform 400 corresponding to whether or not the transition bit being zoomed onto is higher than the voltage threshold of voltage comparator 208 (FIG. 2).

If the threshold voltage of voltage comparator 208 is programmable, sweeping the threshold voltage can help generate a complete voltage waveform for a data bit of interest without requiring a window comparator or additional strobe circuitry. Referring to FIGS. 2 and 5, FIG. 5 illustrates the setting of the threshold voltage of voltage comparator 208 (FIG. 2) to a fixed value VB and running time-base generator 240 for a bit 500 of interest of data pattern 260B. The result is a sequence 504 of ones and zeros that may be stored in accumulation memory 280. Incrementing the threshold voltage of voltage comparator 208 and re-running time-base generator 240, another sequence of ones and zeros is generated, and it is added to the previous set. As the sweep proceeds, a thermometer code like the thermometer code 600 shown in FIG. 6 is obtained. Of course, in the exemplary implementation, the values of the thermometer code are directly accumulated in accumulation memory 280. It should be noted that this operation is different from the operation of generating bit error rate (BER) contour plots. This operation is literally a digitization operation of a repetitive voltage transition. It does not represent an error count the way a BER does.

Figure 7:
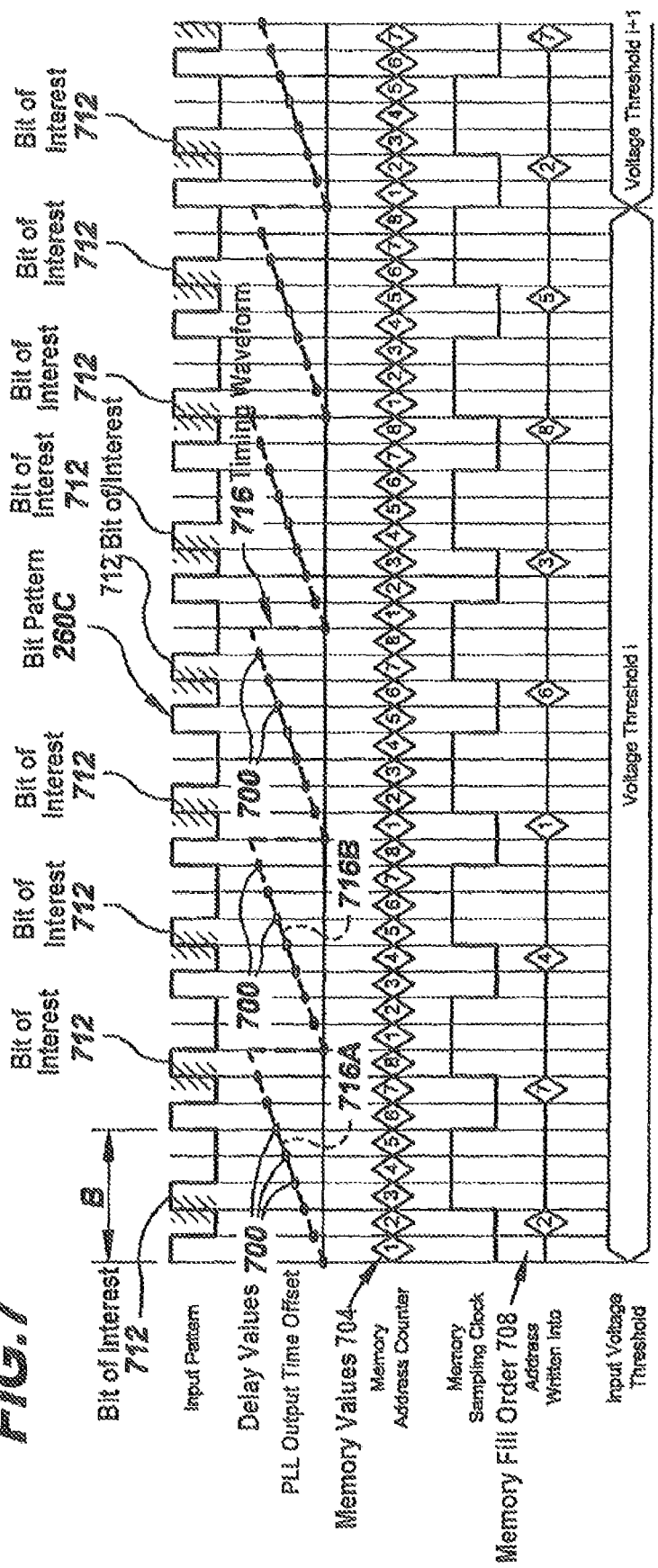
FIG. 7 is a timing diagram illustrating the operation of the digital pattern testing system of FIG. 2 for a bit-pattern length of 5.

Returning to accumulation memory 280 and time-base generator 240 of FIG. 2, specific selection of the length of accumulation memory 280 (and time-base ramp length) with respect to repeating pattern 260 under test is required. Most simplistically, if data pattern 260 being measured has an even length, the length of accumulation memory 280 (representing the time axis in the digitization process) is selected to have an odd number of locations. Conversely, if the pattern length is odd, the length of accumulation memory 280 (and corresponding time-base generator ramp) is even. Referring to FIGS. 2 and 7, FIG. 7 shows an exemplary test pattern 260C (FIG. 2), exemplary time delay values 700 outputted by the time-base generator 240, exemplary memory address values 704, and the order 708 in which the memory values are filled. In the figure, pattern 260C has a length B of 5 bits and a bit 712 of interest. Time-base generator 240 ramps through its various delays in a duration equivalent to 8 bit-values. As can be seen, all memory values 704 are eventually filled as long as the sufficient number of iterations of the PLL ramp and of the bit stream is sequenced. If the length of accumulation memory 280 is not selected properly, aliasing effects occur, and erroneous measurements are made. In general, the number of iterations of the time-base ramp or the bit pattern 260C corresponds to the least common multiple between the pattern length B and the time-base span N. In the example of FIG. 7, the least common multiple between 5 and 8 is 40. So, 8 iterations of pattern 260C (or 5 of the time-base ramp) are required. Still referring to FIG. 7, notice how, at the start 716A of the timing waveform 716 shown, as PLL multiplier 220 keeps toggling and ramping its output delay, it comes across the bit of interest 712 (transition of interest) twice. This means that voltage comparator 208 samples that particular bit 712 (transition) with a small delay at first, then with a large delay subsequently. In the next iteration 716B of the ramp timing waveform 716, PLL multiplier 220 comes across the same transition repetitively again, but each time it does so, it does it with a unique one of delay value 700.

Concerning lengths of accumulation memory 280, the time-base span is typically in the order of hundreds of samples (e.g. 512) because it becomes overkill to create much larger timing resolution. Length B of bit pattern 260, on the other hand, can be much smaller (e.g. 5 in the example above) or much larger (e.g., thousands of bits).

Figure 8A:
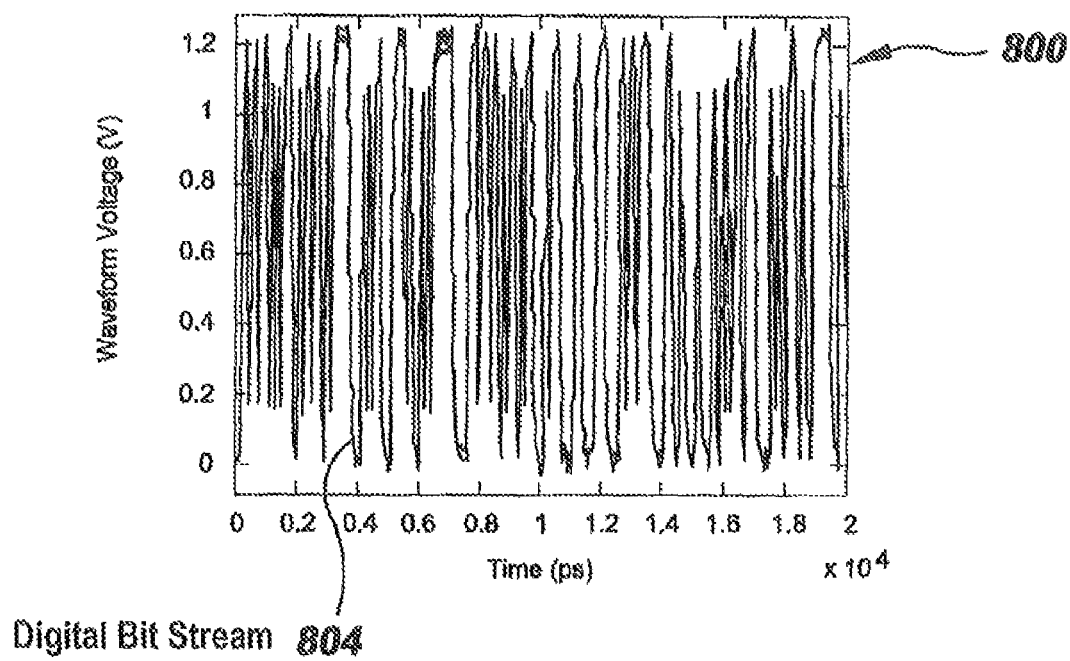
FIG. 8A is a plot of waveform voltage versus time of an exemplary digital bit stream as outputted using the oscilloscope functionality of a digital pattern testing system of the present disclosure.
Figure 8B:
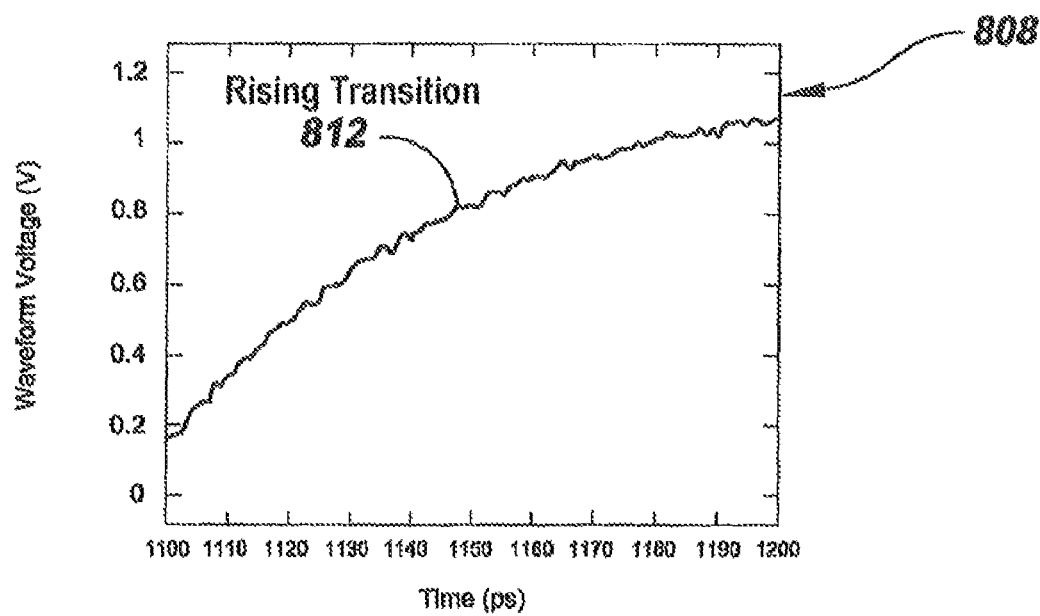
FIG. 8B is a zoomed-in plot of waveform voltage versus time for a rising edge of a bit transition as outputted using the oscilloscope functionality of a digital pattern testing system of the present disclosure.
Figure 8C:
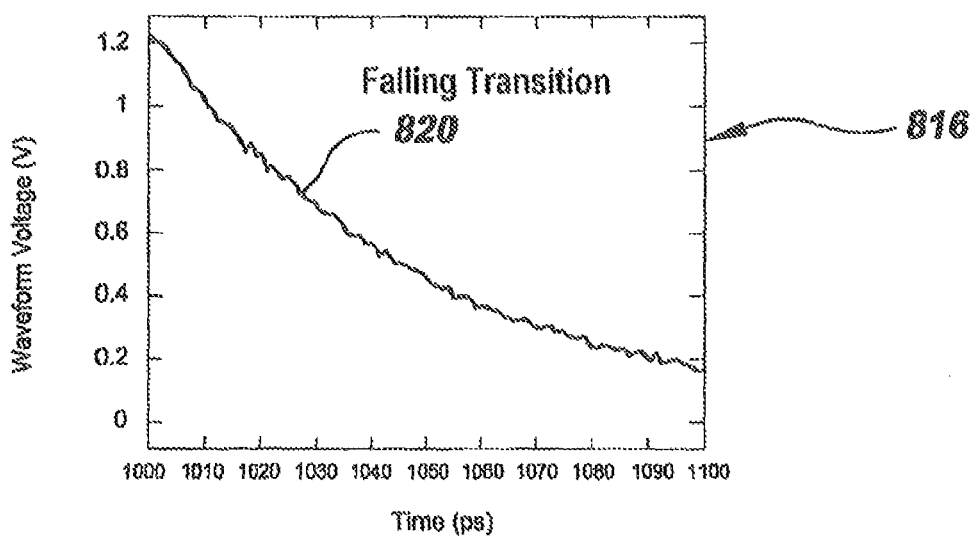
FIG. 8C is a zoomed-in plot of waveform voltage versus time for a falling edge of a bit transition as outputted using the oscilloscope functionality of a digital pattern testing system of the present disclosure.
Figure 8D:
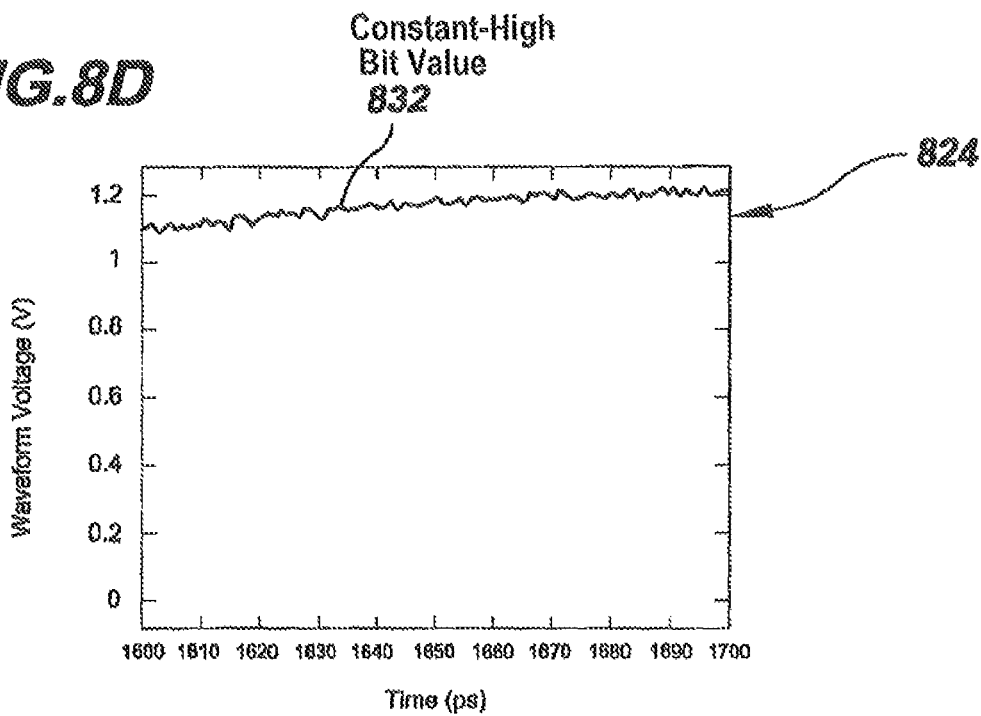
FIG. 8D is a zoomed-in plot of waveform voltage versus time for a constant high bit value as outputted using the oscilloscope functionality of a digital pattern testing system of the present disclosure.
Figure 8E:
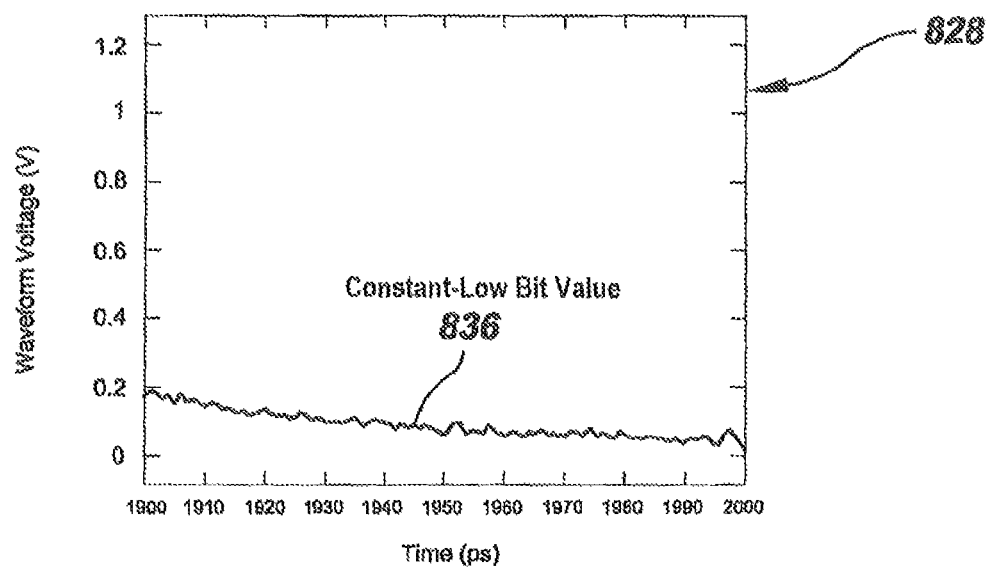
FIG. 8E is a zoomed-in plot of waveform voltage versus time for a constant low bit value as outputted using the oscilloscope functionality of a digital pattern testing system of the present disclosure.

FIG. 8A shows an example of an output plot 800 of example digital bit stream 804 as generated using the oscilloscope functionality of an oscilloscope-enabled testing system made in accordance with the present disclosure, such as digital pattern testing system 200 of FIG. 2. Because of bandwidth limitations and lossy transmission, bit stream 804 shows slow rise time and significant voltage noise. These effects are examples of what is being tested using an oscilloscope-enabled testing system of the present disclosure. FIG. 8B shows an example of plot 808 generated by an oscilloscope-enhanced testing system of the present disclosure, such as digital pattern testing system 200 of FIG. 2, when the testing system is zoomed in onto a rising transition 812. FIG. 8C shows an example of plot 816 generated by an oscilloscope-enhanced testing system of the present disclosure, such as digital pattern testing system 200 of FIG. 2, when the testing system is zoomed in onto a falling transition 820. FIGS. 8D and 8E show, respectively, exemplary plots 824, 828 generated by an oscilloscope-enhanced testing system of the present disclosure, such as digital pattern testing system 200 of FIG. 2, when the testing system is zoomed in onto constant high and constant low bit values 832, 836, respectively.

Figure 9:
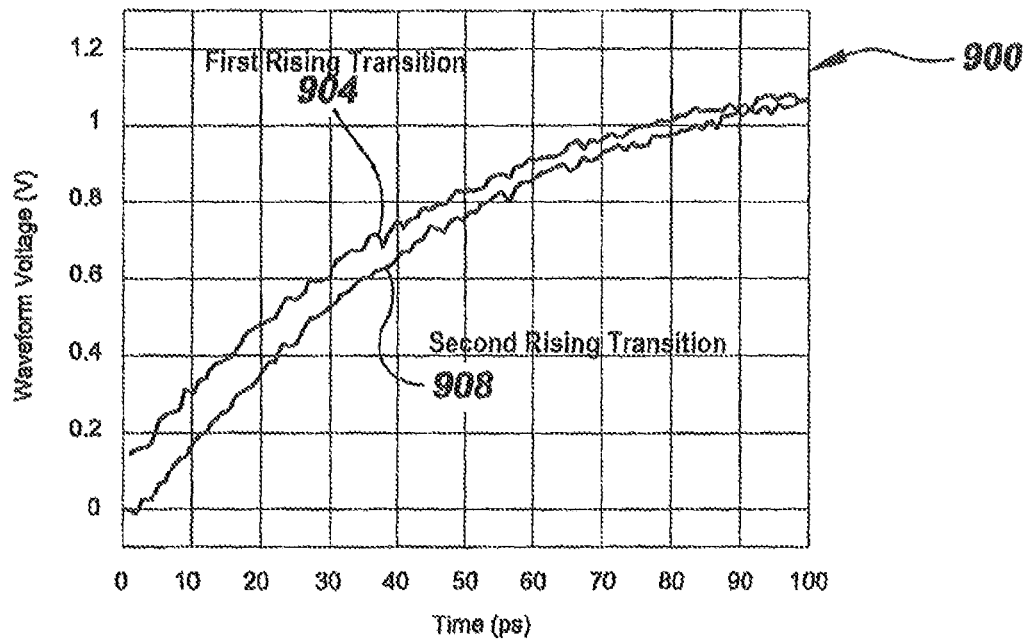
FIG. 9 is an overlay plot of waveform voltage versus time for two rising transitions that exhibit data-dependent jitter as outputted using the oscilloscope functionality of a digital pattern testing system of the present disclosure.

As can be seen, an oscilloscope-enabled testing system of the present disclosure has great utility in identifying problem areas in a digital bit stream. For example, data-dependent jitter can easily be extracted since, now, the average arrival time of each transition in a bit stream is made available. FIG. 9 shows an example plot 900 containing an overlay of two rising transitions 904, 908 that exhibit data-dependent jitter. As can be readily seen, transitions 904, 908 occur at different times. Similarly, histograms on particular edges can be extracted to learn about jitter parameters that are non-data-dependent. Finally, all transition edges can be accumulated together to generate eye masks or eye diagrams. Those skilled in the art will understand how to implement these and other additional oscilloscope related features using the concepts disclosed herein.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for testing a high-speed repeating data signal, comprising:

a time-base generator responsive to a reference clock signal so as to generate a high-speed repeating signal;
a one-bit voltage digitizer for digitizing the high-speed repeating data signal into a digitized signal as a function of the high-speed repeating signal;
a digital comparator for comparing the digitized signal to a selected digital value and outputting comparator results as a function of the high-speed repeating signal;
a bit-shift and frequency-divider block responsive to the high-speed repeating signal so as to produce a slowed clock signal;
a sub-sampler for sub-sampling the comparator results as a function of the slowed clock signal so as to output sub-sampled results;
a modulo N address counter, wherein N is greater than zero, for providing write addresses as a function of the high-speed repeating signal; and
an accumulation memory for storing ones of the sub-sampled results as a function of the slowed clock signal and corresponding respective ones of the write addresses.

2. The system of claim 1, wherein said one-bit voltage digitizer comprises a voltage comparator.

3. The system of claim 1, wherein said time-base generator includes modulation circuitry for generating a rapidly varying phase signal as a function of the reference clock signal.

4. The system of claim 3, wherein said time-base generator includes a phase-locked loop for receiving the rapidly varying phase signal and outputting the high-speed repeating signal.

5. The system of claim 3, wherein said modulation circuitry includes clock-selection circuitry for continually selecting from among differing-delay versions of the reference clock signal so as to generate the rapidly varying phase signal.

6. The system of claim 5, wherein said modulation circuitry further includes a delay element for receiving the reference clock signal and outputting a shifted clock signal phase-shifted relative to the reference clock signal, said clock-selection circuitry including a first multiplexer for receiving the reference clock signal and the shifted clock signal.

7. The system of claim 6, wherein said delay element is programmable in coarse increments.

8. The system of claim 6, wherein said first multiplexer includes an output and a select port, said modulation circuitry also including a selection signal generator in operative communication with said select port of said multiplexer and configured to generate a high-frequency selection signal for causing said multiplexer to continually select between the reference clock signal and the delayed clock signal.

9. The system of claim 8, wherein said selection signal generator comprises a circular memory clocked by the reference clock signal.

10. The system of claim 1, further comprising a selector for outputting the selected digital value, said selector for selecting between a bit pattern and a constant bit value.

11. The system of claim 1, further comprising a reference-pattern memory for storing a reference bit pattern having a length, said bit shift and frequency divider dividing the high-speed repeating signal the length.

12. The system of claim 1, further comprising a reference-pattern memory for storing a reference bit pattern having a length, said time-base generator having a time-base span, and the length and the time-base span having opposite evenness.

13. The system of claim 1, wherein said time-base generator has a time-base span and said accumulation memory has a length equal to the time-base span or a multiple of the time-base span.

14. The system of claim 1, further comprising a reference-pattern memory for storing a reference bit pattern having a length, said accumulation memory having a length of opposite evenness relative to the length of the reference bit pattern.

15. A system for testing a high-speed repeating data signal, comprising: oscilloscope circuitry that includes:
- a time-base generator responsive to a reference clock signal so as to generate a high-speed repeating signal;
- a one-bit voltage digitizer for digitizing the high-speed repeating data signal into a digitized signal as a function of the high-speed repeating signal;
- a reference pattern memory for storing a reference bit pattern having a length;
- a selector for selecting between the reference bit pattern and a constant bit value so as to output a selected digital value;
- a digital comparator for comparing the digitized signal to the selected digital value and outputting comparator results as a function of the high-speed repeating signal;
- a bit-shift and frequency-divider block responsive to the high-speed repeating signal so as to produce a slowed clock signal, said bit shift and frequency divider block divides the high-speed repeating signal the length;
- a sub-sampler for sub-sampling the comparator results as a function of the slowed clock signal so as to output sub-sampled results;
- a modulo N address counter, wherein N is greater than zero, for providing write addresses as a function of the high-speed repeating signal; and
- an accumulation memory for storing ones of the sub-sampled results as a function of the slowed clock signal and corresponding respective ones of the write addresses.

16. The system of claim 15, wherein said one-bit voltage digitizer comprises a voltage comparator.

17. The system of claim 15, wherein said time-base generator has a time-base span, and the length and the time-base span having opposite evenness.

18. The system of claim 15, wherein said time-base generator has a time-base span and said accumulation memory has a length equal to the time-base span or a multiple of the time-base span.

19. The system of claim 15, wherein said accumulation memory has a length of opposite evenness relative to the length of the reference bit pattern.

20. A method of implementing an oscilloscope to analyze a high-speed data signal, comprising:
- digitizing the high-speed data signal into a one-bit digitized signal in response to a repeating a time-based span having a time-base span N;
- comparing the one-bit digitized signal to a constant bit value in response to the repeating time-base signal so as to generate comparator results;
- dividing the repeating time-base signal so as to create a slowed clock signal corresponding to high-speed data period;
- sub-sampling the comparator results in response to the slowed clock signal so as to output sub-sampled results;
- generating modulo N write addresses, wherein N is greater than zero, as a function of the repeating time-base signal; and
- storing ones of said sub-sampled results in a memory in response to the slowed clock signal and corresponding respective ones of the write addresses.

21. The method of claim 20, wherein the storing of ones of the sub-sampled results includes accumulating the sub-sampled results so as to generate a thermometer code.

22. The method of claim 20, further comprising generating the repeating time-base signal as a function of continually selecting between clock signals of differing delay to create a composite signal and phase filtering the composite signal to achieve the repeating time-base signal.

23. The method of claim 22, wherein said continually selecting between the clock signals is performed using a selection signal, the method further including generating the selection signal as a function of the contents of a circular memory.

24. The method of claim 22, wherein said phase filtering of the composite signal comprises phase filtering the composite signal with a phase-locked loop.

* * * * *